United States Patent [19]

Yamaura et al.

[11] 4,328,551
[45] May 4, 1982

[54] APPARATUS AND METHOD FOR PROTECTION OF ELECTRIC POWER TRANSMISSION LINES AND THE LIKE

[75] Inventors: Mitsuru Yamaura, Hachioji; Ryotaro Kondow, Tokyo; Kunio Matsuzawa, Sagamihara, all of Japan

[73] Assignee: Tokyo Shibaura Denki Kabushiki Kaisha, Kawasaki, Japan

[21] Appl. No.: 130,569

[22] Filed: Mar. 14, 1980

[30] Foreign Application Priority Data

Mar. 19, 1979 [JP]  Japan ................... 54-31017

[51] Int. Cl.³ .................... G06F 15/56; H02H 3/00
[52] U.S. Cl. .................... 364/492; 364/900; 361/80
[58] Field of Search .......... 364/480, 482, 492, 493, 364/900, 483; 324/52; 361/80

[56] References Cited

U.S. PATENT DOCUMENTS

| | | | |
|---|---|---|---|
| 3,810,116 | 5/1974 | Prohofsky | 364/200 |
| 3,984,737 | 10/1976 | Okamura et al. | 364/492 X |
| 4,050,096 | 9/1977 | Bennett et al. | 364/200 |
| 4,090,250 | 5/1978 | Carison et al. | 364/900 |
| 4,107,778 | 8/1978 | Nii et al. | 364/483 X |
| 4,161,027 | 7/1979 | Russell | 364/492 |
| 4,183,072 | 1/1980 | Takagi et al. | 364/482 X |
| 4,218,737 | 8/1980 | Buscher et al. | 364/493 |
| 4,228,476 | 10/1980 | Okita et al. | 364/492 X |

*Primary Examiner*—Edward J. Wise
*Attorney, Agent, or Firm*—Kenyon & Kenyon

[57] ABSTRACT

In a protective relaying apparatus for an electric power transmission system and the like there is provided a nonvolatile memory device in which various values required for protection of the system are written electrically. An input device designates addresses in the memory device and memorizes values in the addresses under control of a control device. A digital processing device carries out the protective operations for the electric power transmission system based on the values thus set in the non-volatile memory device.

10 Claims, 4 Drawing Figures

APPARATUS AND METHOD FOR PROTECTION OF ELECTRIC POWER TRANSMISSION LINES AND THE LIKE

BACKGROUND OF THE INVENTION

This invention relates to apparatus and a method for protecting an electric power system, in which a digital processing device such as a microcomputer is utilized and in which various values required for protecting the electric power system can be easily set.

In an ordinary protective relaying apparatus for protecting an electric power system, various values required for protecting the system were set beforehand by means of devices having setting taps, rotary switches, variable resistors and the like. More specifically, a distance relaying apparatus for protecting a transmission line can be made of a combination of one or more of over-current relays, undervoltage relays, mho relays, reactance relays, overvoltage relays, directional relays and the like, each requiring various values for its operation. As a result, the total number of setting devices required for such a distance relaying apparatus becomes extremely numerous, and furthermore since the values required for the protection of electric power transmission lines differ in accordance with the type of transmission line, the values must be specifically calculated and set by an operator.

Recently, progress in digital processing techniques have enabled a digital processing device such as a microcomputer to be widely used for the protection of power transmission systems and the like.

One of the advantageous features of digital protective relaying apparatus is that the functions of the various component protective relays described above can be achieved by a single digital processing device operated on a number of programs, and therefore the size of the protective relaying apparatus can be substantially reduced.

However, if a large number of setting devices is used in the protective relaying apparatus, an advantageous feature of reducing the size of the apparatus will not be fully realized.

This difficulty can be obviated by memorizing the large number of setting values which are required for the relaying apparatus in a memory device by means of a single input device. One procedure for realizing this feature utilizes a RAM (Random Access Memory) operable in both writing and reading modes, and another procedure utilizes a ROM (Read Only Memory).

The use of a RAM, however, is not practicable because the values memorized in a RAM will be lost in the event of a power failure, and the use of a ROM is not advantageous because a ROM, in the form of an IC (integrated circuit), requires a special writing device termed a "ROM writer", the operation of which is extremely complicated and which must be used each time rewriting the ROM is required.

SUMMARY OF THE INVENTION

A primary object of the present invention is to provide a protective relaying apparatus for an electric power transmission line and the like, wherein the values required for operation can be easily set and the above described difficulties of conventional protective relaying apparatus can be substantially eliminated.

Another object of the invention is to provide a protective relaying apparatus for an electric power transmission line and the like wherein required values can be set and reset electrically.

Still another object of the invention is to provide a protective relaying apparatus wherein the required values once set (written in) are not volatile (or lost) even in the case of a power failure.

Still another object of the invention is to provide protective relaying apparatus for an electric power transmission line and the like, wherein the number of parts required for setting various values can be substantially reduced.

These and other objects of the present invention can be achieved by a protective relaying apparatus for an electric power system, the apparatus comprising a non-volatile memory device, in which values can be written electrically, an input device for designating addresses and setting values in the designated addresses in the non-volatile memory device, a control circuit for controlling both the memory device and the input device in the value setting operation, and a digital processing device for carrying out protective operations for the electric power system based on the values thus set in the non-volatile memory device.

The digital processing device preferably comprises a microcomputer including a volatile data memory device, and the contents of the non-volatile memory device are preferably transferred periodically from the non-volatile memory device to a volatile data memory device using a time period other than the setting time of the values in the non-volatile memory device, so that the thus transferred values are utilized for the protection of the electric power system.

Preferably the non-volatile memory device has a number of memory cells each comprising a non-volatile metal oxide semiconductor field-effect transistor (MNOS FET) and a metal oxide semiconductor (MOS) flip-flop combined together into a single pair.

DESCRIPTION OF THE PREFERRED EMBODIMENT

Figure 1:
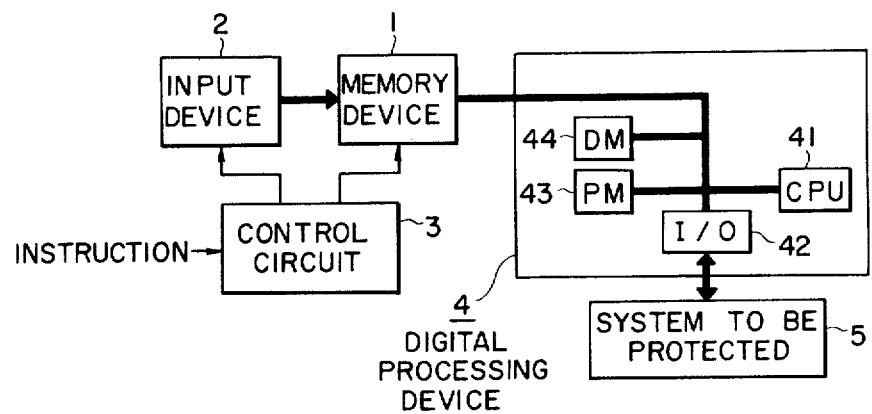
FIG. 1 is a block diagram showing an embodiment of the present invention.

Referring now to FIG. 1, there is shown, in the form of a block diagram, a protective relaying apparatus constituting a preferred embodiment of the present invention.

In the protective relaying apparatus, there are provided a non-volatile memory device 1 capable of writing electrically, and an input device 2 which designates addresses and memorizes values required for the protection of an electric power transmission system in the designated addresses. A control circuit 3 is further provided in the apparatus for controlling the memory device 1 and the input device 2 in accordance with externally applied instructions. The values written in the memory device 1 are read out as desired, and utilized in a digital processing device 4 such as a microcomputer for protecting an electric power transmission system or the like which is designated by the reference numeral 5 in FIG. 1.

The digital processing device 4 such as a microcomputer comprises, as is well known in the art, a central processing unit (CPU) 41, an input-output device (I/O) 42, a program memory device (PM) 43, and a data memory device (DM) 44. Through the input-output device 42, various data required for protection of the system 5 may further be introduced, while the output of the digital processing device is coupled to the system 5. The non-volatile memory device 1 and the data memory device 44 are hereinafter termed first and second memory devices, respectively. Since the digital processing device 4 is not a principal component in the setting operation for the protective relaying apparatus, further detailed description thereof will be omitted.

Figure 4:
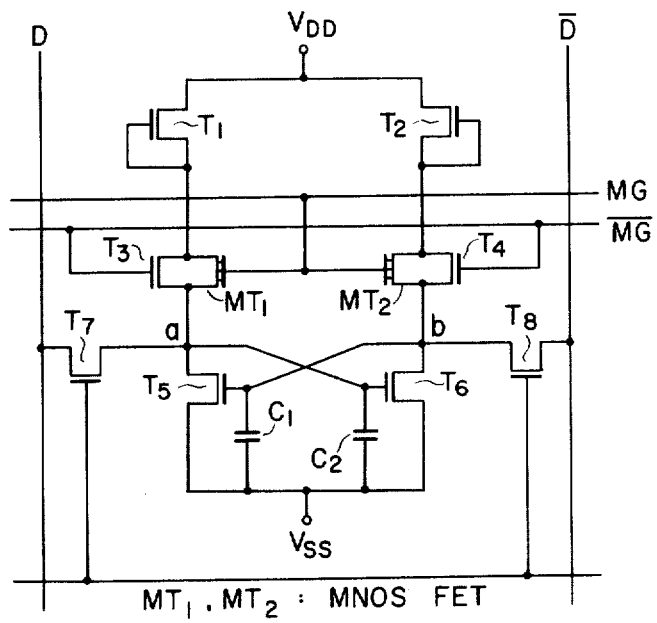
FIG. 4 is a circuit diagram showing a typical memory cell in the non-volatile memory device.

The non-volatile memory device 1 utilizes, for instance, MNOS (Metal Nitride Oxide Semiconductor) elements. More specifically, a memory cell of the memory device 1 may comprise a volatile MOS (Metal Oxide Semiconductor) flip-flop circuit and non-volatile MNOS FET's (Metal Nitride Oxide Semiconductor Field Effect Transistors) combined together as shown in FIG. 4. Since information memorized in the MNOS FET's can be retained even after a power failure, the reproduction of the information can be realized by transferring the retained information into the MOS flip-flop circuits after the supply of power has been resumed.

Heretofore, the above described non-volatile memory device (NVRAM), for example Type TMM 142 made by Tokyo Shibaura Denki K.K., Japan, in which data can be written electrically, has been used in ordinary data processing techniques for providing protection upon the occurrence of a failure. For instance, in the calculation of the equation $x = A + B + C$, if a power failure occurs at an instant at which the calculation of $A + B$ has been completed, the sum $A + B$ and the data C are stored in the non-volatile memory device (NVRAM), so that the remaining part of the calculation can be readily completed when power is stored. In another conventional use, various programs for data processing techniques have been stored instead of the above described data in the non-volatile memory device.

Figure 2:
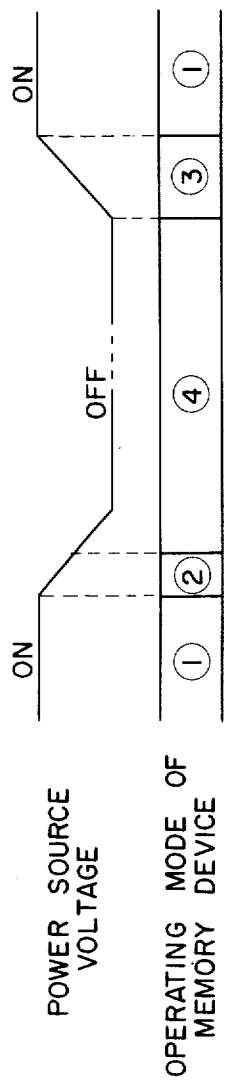
FIG. 2 is a diagram showing the control of a conventional non-volatile memory device capable of writing electrically.

Fig. 2 is a diagram useful in explaining the conventional procedure of controlling an NVRAM.

In FIG. 2, the symbol ① designates a mode of operation wherein data is written in or read out of the MOS flip-flop circuits when power is normal, while the symbol ② designates a mode of operation for transferring the contents of the MOS flip-flop circuits into the MNOS FET's during an early phase of a power failure. The symbol ③ on the other hand designates a mode of operation for bringing back the data from the MNOS FET's into the MOS flip-flop circuits when power is being restored.

According to the present invention, the data preserving capability of the non-volatile memory device of the above described type is uniquely utilized for setting values required for the operation of apparatus for protecting an electric power transmission system and the like without using conventional setting devices.

Figure 3:
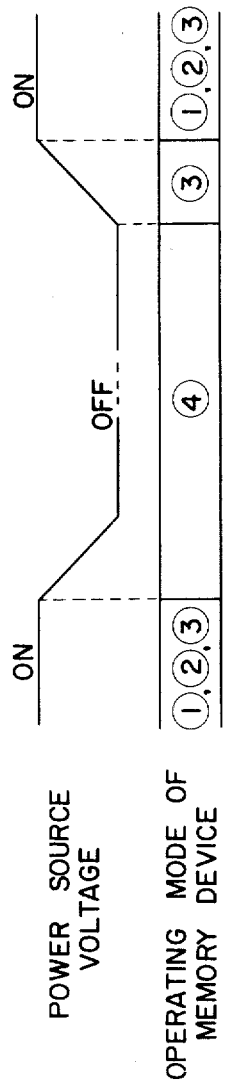
FIG. 3 is a diagram showing the control of a non-volatile memory device used in the present invention, which also can be written electrically.

A novel procedure in utilizing a non-volatile memory device is illustrated in FIG. 3. In FIG. 3, symbol ① designates a mode of operation similar to that for the same symbol shown in FIG. 2 except that the values are only read out of the flip-flop circuits, and symbol ② designates a mode of operation similar to that for the same symbol described above for FIG. 2 wherein the contents of the MOS flip-flop circuits are written in the MNOS FET's, except that according to this invention the contents are written while power is normal. Symbol ③ designates a mode of operation quite similar to that designated by the symbol ③ in FIG. 2, wherein the contents written in the MNOS FET's are transferred to the MOS flip-flop circuits after power has been or is being restored.

Symbol ④ in FIGS. 2 and 3 designates a state wherein the contents of the MOS flip-flop circuits are lost due to a power failure, while the contents of the MNOS FET's are maintained therein.

According to the control procedure of the MNOS FET and the MOS flip-flop circuits described above, the values supplied to the input device 2 in FIG. 1 are electrically written into non-volatile memory device 1 under the control of an instruction given to the control device 3, for example a Type T-3541 made by Tokyo Shibaura Denki K.K., Japan, and the values thus written in the memory device 1 are preserved therein regardless of the power failure. For this reason, the values can be set in the apparatus by a single continuous setting operation and the values thus memorized in the memory device 1 are read out, when required, by the device 4 to be used for protecting the electric power transmission line and the like.

An electrically writable non-volatile memory device such as the Tokyo Shibaura Denki K.K. Type TMM 142 includes a plurality of memory cells, each cell preferably comprising a flip-flop circuit of a construction having two stages alternately brought into a conductive state and each of the stages including a MNOS FET and an MOS FET connected together in a pair.

Setting values memorized in the non-volatile memory device of the above described construction are firstly transferred from the MNOS FET's to MOS FET's in mode ③ , and then read out of the MOS FET's in mode ① to be used for the relaying operation in the digital processing device 4. Although the transferring operation ③ from the MNOS FET's to MOS FET's requires a comparatively long time, the operation can be carried out independently from operation of the digital processing device 4. On the other hand, the time required for reading the setting values out of the MOS FET's is extremely short, and therefore any possibility of the read-out operation of the setting values memorized in the non-volatile memory device disturbing or lowering the efficiency of the protective relaying apparatus can thereby be eliminated.

Furthermore, since the memorized state of the MOS FET's is always made equal to that of the MNOS FET's regardless of the existence of noise and the like, the reliability of the setting values thus read out of the MOS FET's is extremely high. In the above described type TMM 142 non-volatile memory device, the entire contents of the memory device are transferred to the volatile elements MOS FET's simultaneously.

Although in the protective relaying apparatus shown in FIG. 1, the set values required for operation have been read out directly from the non-volatile memory device 1, the apparatus may be modified as follows when the response speed of the non-volatile memory device 1, that is the read-out speed of the device 1, is much slower than the process speed of the digital processing device 4.

More particularly, in the modification, the well-known direct memory accessing (DMA) function of the digital processing device 4 is utilized for reading out the contents of the memory device 1 into a data memory (DM) provided in the processing device 4 by using an idle period in the operation of the device 4. The values thus transferred into the data memory device (DM) may then be utilized as desired in the protective operation of the apparatus of the present invention, and thus the difficulty caused by the slow response of the non-volatile memory device 1 can be eliminated. Furthermore, in order to improve the reliability of the data transferring operation of the set values, it is preferable that the transfer of data utilizing the DMA function of the device 4 is carried out periodically by using idle periods of the digital processing device 4.

What is claimed is:

1. In a protective relaying apparatus for an electric power system comprising an electrically writable memory device and a digital processing device for carrying out protective relaying operations based on values set in the memory device, wherein the improvement comprises an input device, an electrically writable memory device which includes a non-volatile memory device coupled to the digital processing device and to the input device, the input device designating addresses in the non-volatile memory device and setting values utilized by the digital processing device for the relaying operation in memory locations represented by the addresses, and a control circuit coupled to the input device and the non-volatile memory device for controlling the input device and the non-volatile memory device, the non-volatile memory device comprising volatile memory portions and non-volatile memory portions connected together in pairs such that data present in the volatile memory portions can be transferred to corresponding non-volatile portions for storage and data stored in non-volatile portions can be transferred to corresponding volatile portions for use by the digital processing device.

2. The improvement according to claim 1, wherein the volatile memory portions are coupled to the input device for receiving data therefrom and to the digital processing device for transferring data thereto.

3. The improvement according to claim 1, wherein the control circuit causes data to be transferred from the volatile memory portions to the non-volatile memory portions when power to the memory device is at a normal level.

4. The improvement according to claim 1 or 3, wherein the control circuit causes data stored in the non-volatile memory portions to be transferred therefrom to the volatile memory portions when power to the memory device returns to a normal level from an abnormal level.

5. The improvement according to claim 1, wherein the control circuit causes data set in the volatile memory portions to be transferred repeatedly to corresponding non-volatile memory portions for each protective relaying operation of the protective relaying apparatus.

6. The improvement according to claim 1 or 5 wherein the control circuit causes data set in the volatile memory portions to be read out repeatedly for use by the digital processing device for each protective relaying operation of the protective relaying apparatus.

7. The improvement according to claim 1, wherein the digital processing device includes a random access memory, and operates so as to periodically transfer data from the volatile memory portions of the non-volatile memory device into the random access memory utilizing a time interval other than the time in which values are being set into the non-volatile memory device, and the values thus transferred into the random access memory device are used for protective relaying operations.

8. The improvement according to claim 1, wherein the volatile memory portions and the non-volatile memory portions of the non-volatile memory device are formed by metal oxide semiconductor (MOS) elements and metal nitride oxide simiconductor (MNOS) elements, respectively.

9. A method for protecting an electric power system utilizing a protective relaying apparatus comprising an electrically writable memory device having volatile memory portions and non-volatile memory portions connected together in pairs such that data present in the volatile memory portions can be transferred to corresponding non-volatile portions for storage and data stored in non-volatile portions can be transferred to corresponding volatile portions for use by the digital processing device, and a digital processing device for carrying out protective relaying operations based on values set in the memory device, the method comprising the steps of designating addresses in the memory device and setting values to be utilized by the digital processing device for the relaying operation in memory locations of the volatile memory portions of the memory device represented by the addresses, the values set in the volatile memory portions being available for use by the digital processing device, and transferring the values set in the volatile memory portions to corresponding non-volatile memory portions when the power level of the supply for the memory device is normal.

10. The method of claim 9, wherein the step of transferring data from the non-volatile memory portions to corresponding volatile memory portions and the further step of reading data out of the volatile memory portions for digital processing device in a relaying operation are carried out repeatedly for each protective relaying operation of the protective relaying apparatus.

* * * * *